United States Patent
Kumar et al.

(10) Patent No.: US 11,276,625 B2
(45) Date of Patent: Mar. 15, 2022

(54) METHODS OF FORMING FLEXURE BASED COOLING SOLUTIONS FOR PACKAGE STRUCTURES

(71) Applicant: Intel Corporation, Santa Clara, CA (US)

(72) Inventors: Siddarth Kumar, Chandler, AZ (US); Shubhada H. Sahasrabudhe, Gilbert, AZ (US); Sandeep B. Sane, Chandler, AZ (US); Shalabh Tandon, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 497 days.

(21) Appl. No.: 16/328,614

(22) PCT Filed: Sep. 29, 2016

(86) PCT No.: PCT/US2016/054332
§ 371 (c)(1),
(2) Date: Feb. 26, 2019

(87) PCT Pub. No.: WO2018/063213
PCT Pub. Date: Apr. 5, 2018

(65) Prior Publication Data
US 2021/0280495 A1 Sep. 9, 2021

(51) Int. Cl.
*H01L 23/367* (2006.01)
*H01L 23/40* (2006.01)
(Continued)

(52) U.S. Cl.
CPC ...... *H01L 23/4006* (2013.01); *H01L 21/4882* (2013.01); *H01L 23/427* (2013.01);
(Continued)

(58) Field of Classification Search
None
See application file for complete search history.

(56) References Cited

U.S. PATENT DOCUMENTS 5,909,057 A   6/1999   McCormick et al.
6,367,263 B1 * 4/2002   Scott ..................... H01L 23/433
                                                              62/6
(Continued)

FOREIGN PATENT DOCUMENTS

KR   20140105371   9/2014

OTHER PUBLICATIONS

International Search Report and Written Opinion for International Patent Application No. PCT/US16/54332, dated Jun. 29, 2017.
(Continued)

*Primary Examiner* — Benjamin P Sandvik
(74) *Attorney, Agent, or Firm* — Essential Patents Group, LLP.

(57) ABSTRACT

Methods/structures of joining package structures are described. Those methods/structures may include a first side of a die disposed on a first side of a substrate, and a cooling structure on a second side of the die, wherein the cooling structure comprises a first section attached to the substrate, and a second section disposed on a second side of the die, wherein the first and second sections are separated by an opening in the cooling structure. The opening surrounds a portion of the second section, and at least one flexure beam structure connects the first and second sections.

25 Claims, 13 Drawing Sheets

(51) Int. Cl.
*H01L 21/48* (2006.01)
*H01L 23/427* (2006.01)

(52) U.S. Cl.
CPC .............. *H01L 2023/4062* (2013.01); *H01L 2023/4068* (2013.01); *H01L 2023/4087* (2013.01)

(56) References Cited

U.S. PATENT DOCUMENTS

| | | | | |
|---|---|---|---|---|
| 6,775,140 | B2* | 8/2004 | Shim | H01L 21/4878 361/704 |
| 6,882,041 | B1* | 4/2005 | Cheah | H01L 21/54 257/704 |
| 2004/0238944 | A1* | 12/2004 | Bish | H01L 23/10 257/706 |
| 2005/0027055 | A1* | 2/2005 | Dani | H01L 23/3733 524/439 |
| 2006/0017155 | A1* | 1/2006 | Wang | H01L 23/3675 257/703 |
| 2007/0096299 | A1 | 5/2007 | Pavier | |
| 2008/0211088 | A1* | 9/2008 | Sato | H01L 23/36 257/717 |
| 2013/0308274 | A1 | 11/2013 | Murdock et al. | |
| 2014/0239482 | A1* | 8/2014 | Kourakata | H01L 25/0655 257/712 |
| 2014/0239488 | A1 | 8/2014 | Kobayashi et al. | |
| 2016/0155682 | A1 | 6/2016 | Ahuja et al. | |
| 2018/0331011 | A1* | 11/2018 | Rivera | H01L 23/3675 |

OTHER PUBLICATIONS

Yong, Y.K. et al., "Design, Identification, and Control of a Flexure-Based XY Stage for FAst Nanoscale Positioning", IEEE Transactions on Nanotechnology; vol. 8; No. 1; Jan. 2009.

* cited by examiner

METHODS OF FORMING FLEXURE BASED COOLING SOLUTIONS FOR PACKAGE STRUCTURES

CLAIM OF PRIORITY

This Application is a National Stage Entry of, and claims priority to, PCT Application No. PCT/US16/54332, filed on 29 Sep. 2016 and titled "METHODS OF FORMING FLEXURE BASED COOLING SOLUTIONS FOR PACKAGE STRUCTURES", which is incorporated by reference in its entirety for all purposes.

BACKGROUND OF THE INVENTION

Assembly processes, which include the assembly of thermal solutions for multi-chip microelectronic package structures, may introduce detrimental, non-uniform stresses within die that are coupled with such package structures. Substantial yield loss may occur during assembly processes due to the such deleterious stress introduction.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
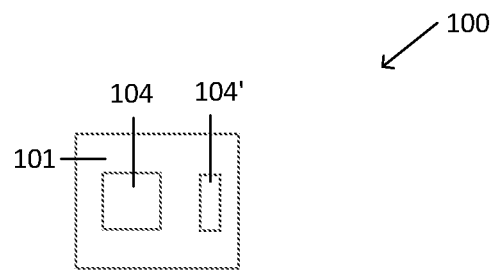
FIGS. 1a-1c represent top views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device, in the embodiments below. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device. In one embodiment, the die may include a processing system (either single core or multi-core). For example, the IC die may comprise a microprocessor, a graphics processor, a signal processor, a network processor, a chipset, etc. In one embodiment, an IC die comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices/die.

In some cases, a heat spreader or lid, such as an integrated heat spreader—having a first surface and an opposing second surface that faces a back surface of a die may be disposed over the die and may be thermally coupled with (and perhaps mechanically coupled with) the die's back surface. Optionally, a layer of thermal interface material may be located between the backside of the die and the heat spreader. A heat sink (or other cooling device) may be thermally coupled with the heat spreader, and another layer of a thermal interface material may be disposed between the heat spreader's first surface and the heat sink (or other device).

By way of example, the heat sink may comprise a multi-fin (or multi-pin) heat sink secured over the heat spreader and die by a retention mechanism.

The heat spreader may be comprised of any suitable thermally conductive materials and may have any suitable shape or structure. For example, the heat spreader may comprise a lid having a side wall (or walls) extending towards the first side of a substrate, with this wall (or walls) being secured to the substrate surface by an adhesive. Materials that may be used to construct the heat spreader include metals (e.g., copper and alloys thereof), thermally conductive composites, and thermally conductive polymers. A wetting layer (e.g., nickel) or other coating may be disposed over at least a portion of the heat spreader's surface.

The TIM layer may comprise any suitable thermally conductive material capable of forming a thermally conductive (and perhaps mechanical) bond between a die and a heat spreader. For example, the TIM layer may comprise a solder material, a composite material, a thermally conductive polymer, as well as any combination of these and/or other materials.

Embodiments of methods of forming packaging structures, such as forming flexure based cooling structures for a microelectronic package structure, are described. Those methods/structures may include a first side of a die disposed on a first side of a substrate, and a cooling structure on a second side of the die, wherein the cooling structure comprises a first section attached to the substrate, and a second section disposed on a second side of the die, wherein the first and second sections are separated by an opening in the cooling structure. The opening surrounds a portion of the second section, and at least one flexure beam structure connects the first and second sections. The embodiments herein enable the decoupling of assembly loads from the die and the rest of the cooling structure. The cooling structures herein serve to prevent die damage in thermal enabling load systems by stress re-distribution, for example.

Figure 1B:
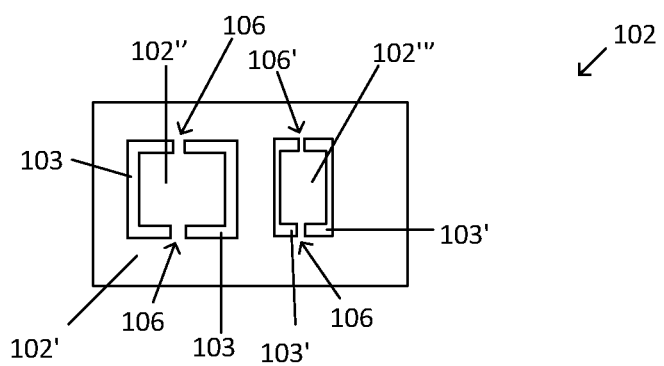
Figure 1C:
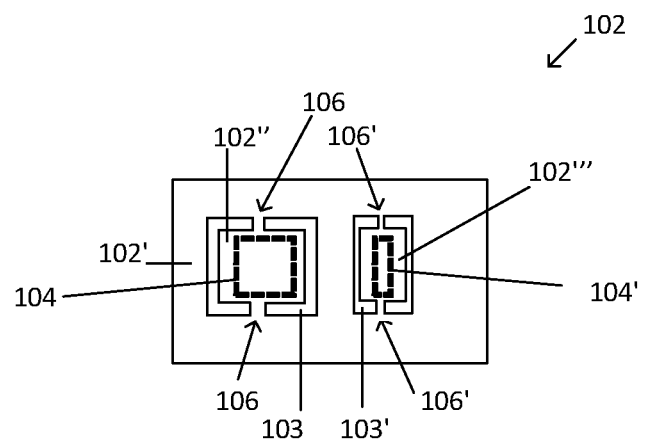

FIGS. 1a-1c illustrate top views of embodiments of fabricating flexure based designs incorporated into a cooling structure for package structures. In FIG. 1a, a top view of a portion of package structure 100 is shown, which may comprise a first die 104 and a second die 104', on a substrate 101, such as a package substrate, an interposer, or a motherboard, for example. The substrate 101, may comprise any suitable substrate 101 materials, such as but not limited to dielectric and conductive materials, for example. FIG. 1b depicts a cooling structure 102 (which may serve to cool the die/package structure 100, for example), wherein the cooling structure 102 may comprise a heat spreader, in an embodiment, such as an integrated heat spreader (IHS), 102 for example. The cooling structure 102 may subsequently be placed/disposed on the first and second die 104, 104' of FIG. 1a.

In an embodiment, the cooling structure 102 may comprise a first portion 102', which may comprise a bulk portion that may be disposed on/over a portion of the substrate 101, in an embodiment, a second portion 102", which may subsequently be disposed/may cover the first die 104, and a third portion 102''', which may subsequently be disposed on/placed onto the second die 104'. In an embodiment, openings 103, 103' may be adjacent/surrounding the dies 104, 104', and may define the second and third portions 102", 102''' of the cooling structure. Flexure beams/bars 106, 106' may be directly adjacent the openings 103, 103', and may connect/directly physically couple the die portions/die plates 102", 102''' to the bulk portion 102' of the cooling structure 102. In an embodiment, the flexure structures 106 may comprise a thin portion of the cooling structure 102, and may be located on opposite sides of the second and third portions 102", 102'''. In an embodiment, the cooling structure 102 is substantially planar.

In an embodiment, the second and third portions 102", 102''' of the cooling structure 102 may comprise die specific plates 102", 102''', wherein flexure beam/bar structures 106, 106' connect the bulk portion 102 with the die plate portions 102", 102''' of the cooling structure. The cooling structure 102 may comprise a copper material in an embodiment, and in other embodiments may comprise any suitable metal/conductive materials. In an embodiment, the cooling structure may comprise cut outs on sheet metal structures, and may be manufactured according to standard fabrication techniques including laser cutting, water jet, milling and wire electrical discharge techniques.

FIG. 1c depicts the cooling structure 102 disposed/placed on the dies 104, 104' of the package structure of FIG. 1a. The bulk portion 102' of the cooling structure 102 is connected/coupled to the die plate portions 102", 102''' by the flexure beams 106, 106' respectively. The die plate portions 102", 102''' substantially cover the dies 104, 104', and are separated from each other and substantially from the bulk portion 102' by the openings 103. The flexure beams 106, 106' connecting the bulk portion 102' to the die plate portions 102", 102''' may serve to control/minimize the transfer of loads that may be applied to the package structure 100 comprising the cooling structure 102, from the bulk portion 102' to the die plate portions 102", 102'''. The flexure beams 106, 106' may be designed to be othogonal to a risk loading direction, which may comprise loads in an X, Y and/or Z direction, for example.

In an embodiment, the bulk portion 102' may be connected/coupled to a spring and retention plate assembly (not shown), while the die plate sections 102", 102''' may be coupled with the dies. The various designs of the embodiments included herein of the cooling structure may serve to decouple stresses induced in the bulk portion 102', which may be incurred from assembly factors in the spring and retention plate assembly process, with those stresses that may be transferred to the dies 104, 104'.

Figure 1D:
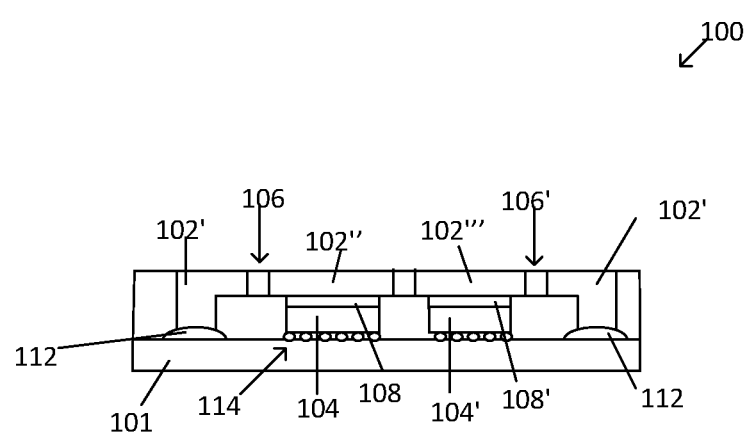
FIG. 1d represents a cross-sectional view of a structures according to embodiments.

FIG. 1d depicts a cross-sectional view of the package structure 100 with the cooling structure 102 placed on a top surface of the dies 104, 104'. In an embodiment, the first and second dies 104, 104' may be disposed on the substrate 101, wherein the substrate 101 may comprise a package substrate, and in some cases may comprise a board, such as a printed circuit board (PCB), for example. In an embodiment, conductive structures 114 may couple the dies 104, 104' to the substrate 101. In an embodiment, the conductive structures 114 may comprise a plurality of solder balls 114, such as a ball grid array 114, for example. In an embodiment, a first plate 108, such as a first copper plate 108, may be disposed between a backside (non-active side) of the first die 104 and the second portion 102" of the cooling structure 102. A second plate 108' may be disposed between the second die 104' and the third portion 102''' of the cooling structure 102.

In an embodiment, the first and second plates 108, 108' may or may not additionally comprise a thermal interface material (TIM) disposed on at least a portion of a top surface of the first and second plates 108, 108' and the second and third portions 102", 102''' of the cooling structure 102. In an embodiment, an edge portion of the bulk portion/section 102' of the cooling structure 102 may be attached to the substrate 101, wherein there may be a sealant 112 connecting the edge portions of the bulk portion 102 to the substrate 101.

In an embodiment, little to no stress may be transferred to the sealant 112 since mechanical loads are decoupled due to the flex design of the cooling structure 102, thus increasing process margin during testing and assembly processing. In another embodiment, degradation of TIM is avoided due to the decoupling of applied loads and the dies 104, 104'. Additionally, in the case of multiple die packages, the amount of keep out zones (located near the sealant) are minimized, since a single cooling structure 102 is used for all of the dies, thus increasing useable space on the board 101. In another embodiment, the cooling structure 102 may further comprise a heat sink (not shown) disposed on a top surface of the cooling structure 102.

Figure 1E:
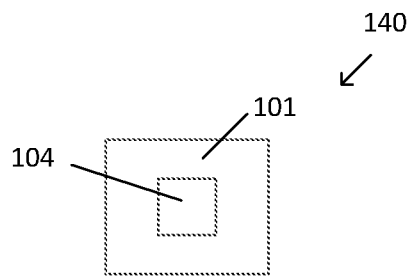
FIGS. 1e-1h represents top views of structures according to embodiments.
Figure 1F:
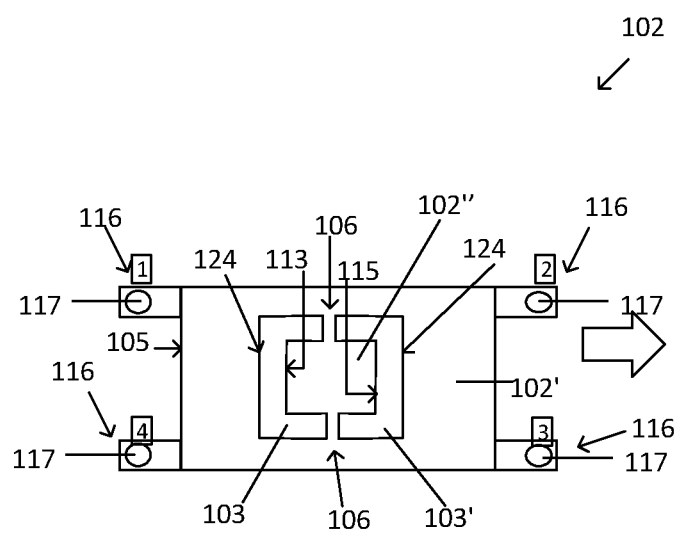

FIG. 1e depicts a top view of a portion of a package structure 140, wherein a first side of a single die 104 is disposed on a substrate 101, and wherein the substrate 101 may comprise a portion of a board, such as a motherboard, an interposer and/or a package substrate. FIG. 1f depicts a top view of a cooling structure 102 comprising a first/bulk portion 102', and a second portion/section 102", wherein the second portion 102" may be disposed on/over a back side/ second side of the die 104, and wherein the first/bulk portion/section 102' may be connected to the second portion 102" by a flexure beam structure 106. The flex beam structure 106 may connect the die plate portion 102" to the bulk portion 102'. In an embodiment, the cooling structure 102 may comprise a copper material, but in other embodiment, may comprise any suitable thermal material providing mechanical and thermal properties to support the die 104. In an embodiment, openings 103, 103' may be directly adjacent the flexure bars/beams 106, which may be located on opposite sides of the die plate 102".

In an embodiment, a first opening 103 may be adjacent a first edge 113 of the second portion 102" and a second opening 103' may be adjacent a second edge 115 of the second portion 102", wherein the second portion 102" may be disposed between the first opening 103 and the second opening 103'. The first section 102' may be disposed adjacent outer edges 124 of the first and second openings 103, 103', wherein the flexible beam structures 106 extend between the first and second sections 102', 102".

The cooling structure 102 may further comprise attachment portions 116. The attachment portions 116 may comprise portion of the cooling structure 102 which may be coupled to/disposed on an edge portion 105 of the cooling structure 102. In an embodiment, the attachment portions 116 may comprise rectangular extensions on the edges portions 105 of the cooling structure, but in other embodiments may comprise any suitable shape/size for the particular application. In an embodiment, the attachment portions 116 of the cooling structure 102 may comprise openings 117, which may comprise openings for fasteners, such as for screws, for example. In an embodiment, four attachment portions 117 may be located in each of the four corners of the cooling structure 102. In other embodiments, there may be more or less than four attachment portions 116 located on the edge portions 105 of the cooling structure 102, depending upon the particular design requirements.

Figure 1G:
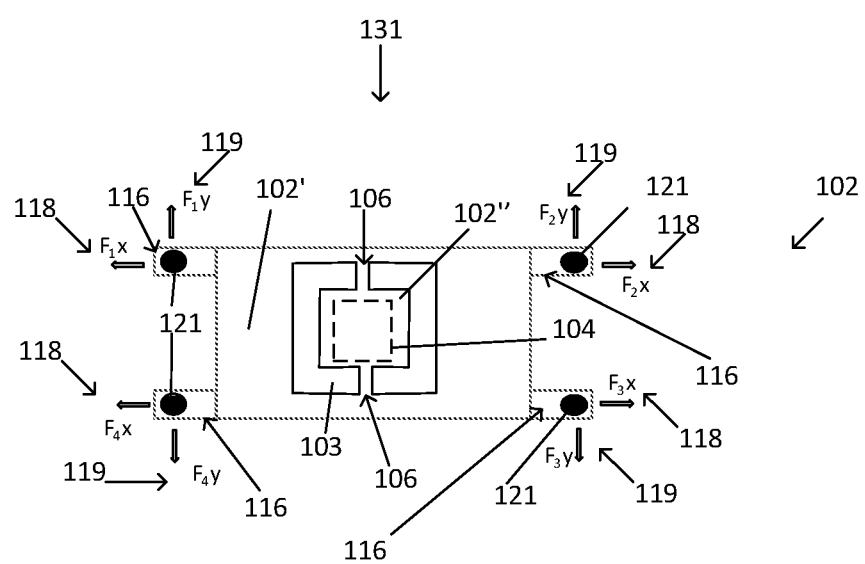

In FIG. 1g, a load 131 may be applied to the package structure 100 when the cooling solution 102 is attached to the package structure 140 comprising the die 104. In an embodiment, the load 131 may comprise an assembly process for example, wherein the thermal solution 102 may be attached/placed onto the substrate 101 (such as the substrate of FIG. 1e, for example). Such an attachment process 131 may generate damaging stresses in the die 104, which may cause cracks and other stress/mechanical related failures in the die 104, and which may negatively impact the performance of the die/device 104. Forces 118 in an X direction and Forces 119 in a Y direction may occur during the assembly process 131. There may be additional forces that occur in a Z direction (not shown), which may occur during the application of fasteners 121 in the openings 117.

In an embodiment, the attachment portions 116 of the cooling structure 102 may receive fasteners 121 in the openings 117. The flexure beams 106 connecting the bulk portion 102' to the die plate section 102" may control the transfer of loads during the assembly process 131 (or during any process which incurs load application to the die 104) from the bulk portion 102' to the die plate portion 102". In an embodiment, the flexure beams 106 may comprise a design that is orthogonal to a risk loading direction. In an embodiment, the flexure bars 106 serve to decouple the strain distribution in the bulk portion 102' induced by the introduction of the four corner screw 116 loads, with the strain located in the die plate sections 102', thus limiting loads transferred to the die 104 underneath the second portion 102" of the cooling structure 102 during assembly processes. In an embodiment, load force components may be distributed away from the die 104 through a flexing motion of the flexure beam structures 106.

Figure 1H:
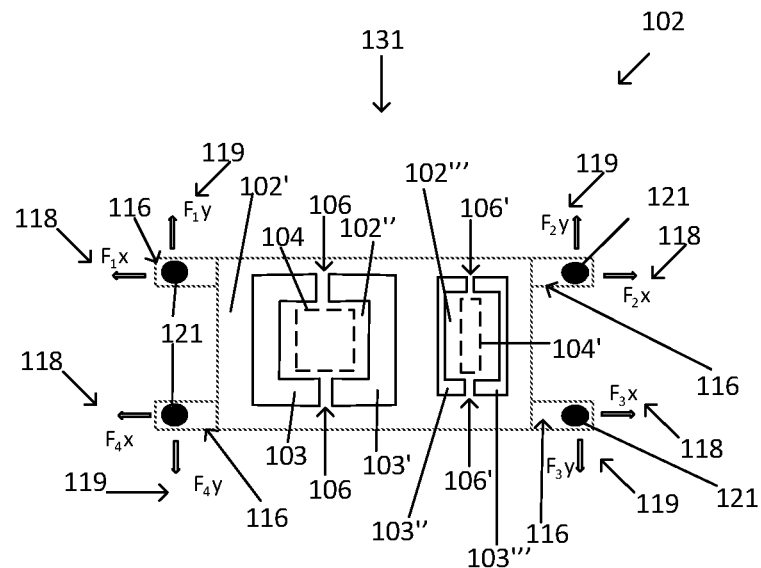

FIG. 1h depicts another embodiment (similar to FIG. 10, wherein a cooling structure 102 comprises a bulk portion 102', a first die plate portion 102" and a second die plate portion 102''', and is disposed on a first die 104 and on a second die 104'. In an embodiment, the cooling structure 102 comprises first, second and third portions 102', 102", 102''', wherein the third portion 102''' is disposed between third and fourth openings 103", 103''', and wherein additional flexure beam structures 106' are disposed between the third portion 102''' and the first 102' portion.

The flexure bars 106, 106' decouple the strain distribution in the bulk portion 102' induced by loads incurred by the corner screws 121, from the strain that may be experienced by the die plate sections 102", 102'''. Thus the cooling structure 102 limits load transfer to the dies 104, 104' underneath the first and second portions 102", 102''' of the cooling structure 102, respectively. In an embodiment, the flexure bars 106, 106' may serve to decouple a strain existing in the bulk portion 102' with that incurred on the first die 104 and the second die 104' due to test loads, or due to customer enabling loads, for example. Reduced die cracking is enabled by the embodiments herein, since applied mechanical loads (especially dynamic loads) are decoupled from the die.

Figure 1I:
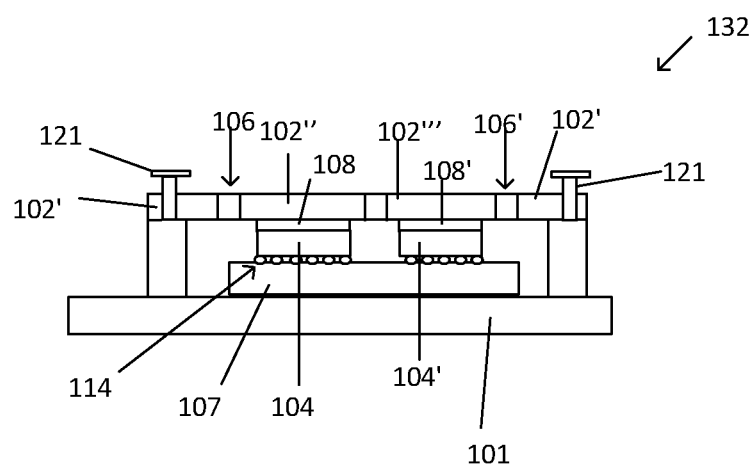
FIG. 1i represents a cross-sectional view of a structures according to embodiments.

FIG. 1i depicts a cross section of an embodiment of a package structure 132, wherein a thermal solution 102 is attached/placed on top of a first and second die 104, 104'. In an embodiment, the first and second dies 104, 104' may be disposed on a package substrate 107, wherein the package substrate 107 may comprise a package substrate for a multi-chip package, and/or may comprise an interposer 107, for example. The package substrate 107 may be disposed on a board 101 which may comprise a motherboard and/or a printed circuit board (PCB), for example. In an embodiment, conductive structures 114 may couple the dies 104, 104' to the package substrate 107.

In an embodiment, first and second plates 108, 108' may be disposed on a top surface of the first die 104 and on a top surface of the second die 104' respectively. The second and third portions 102", 102'" of the cooling structure 102 may be disposed on/over the dies 104, 104' respectively. In an embodiment, the first and second plates 108, 108' may or may not additionally comprise a TIM disposed between top surfaces of the first and second plates 108, 108' and the second and third portions 102", 102'" of the cooling structures 102. In an embodiment, the bulk portion 102' of the cooling structure 102 may be attached to the substrate 101, wherein screws 121 may serve to fasten the cooling structure 102 to the board 101. The flexure beam structures 106, 106' of the cooling structure 102 enable the decoupling of thermal (such as die/TIM degradation, mechanical (for example, warpage) and reliability performance (silicon edge defects, TIM degradation) from the dies 104', 104 of the packaged structure 132.

Figure 1J:
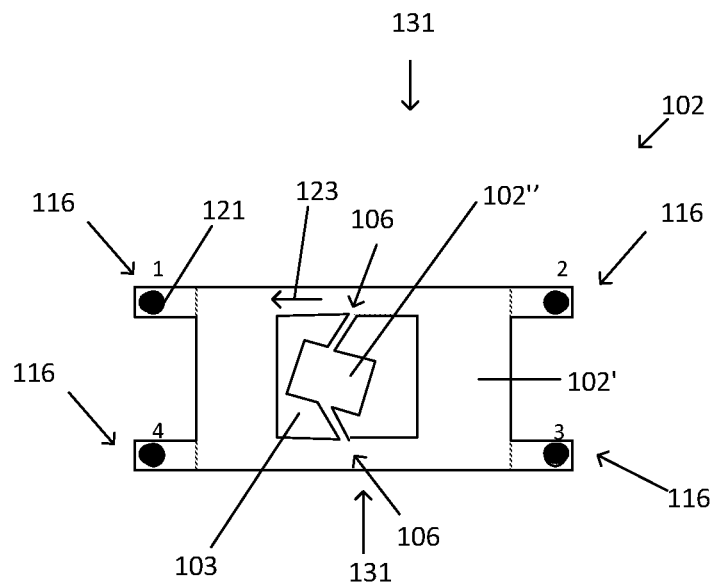
FIGS. 1j-1p represents top views of structures according to embodiments.
Figure 1K:
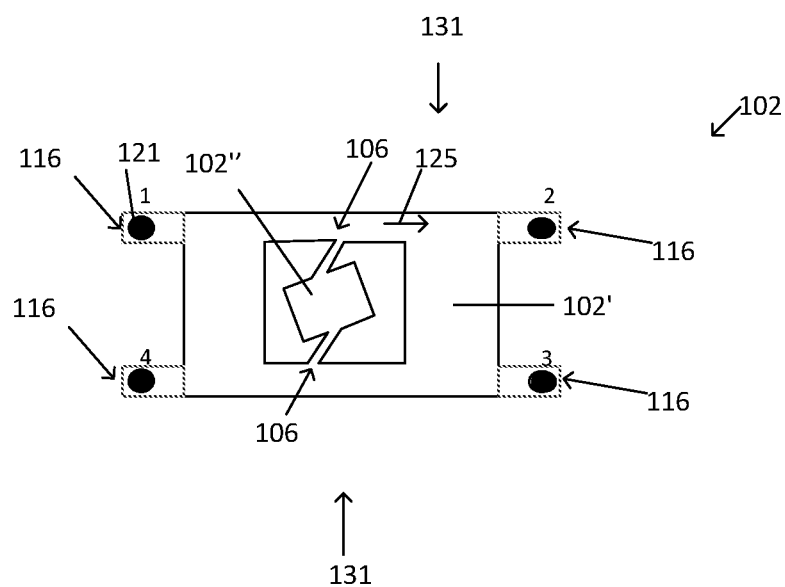

In another embodiment, the employment of curved flexure beams may eliminate uncertainty in a buckling direction that may be experienced by packaged die, in some cases. For example, under an applied load 131 (such as under the application of screws 121 in the openings 116 of the cooling structure 102), the flexure bars 106 and/or die plate 102" (which may be coupled with a die) of the cooling structure 102 may buckle, and may exhibit different buckling modes, which may include buckling in a first direction 123 or buckling in a second direction 125 (FIGS. 1j-1k), however the buckling direction is relatively uncertain. The buckling of the flexure bars 106 may be in an X direction, or may be in another direction or combination of directions (for example, the buckling may be in an X direction, in a Y direction and/or in a Z direction), for example. Different buckling modes, such as between the flexure bars 106, can result in different loads being transferred to the die plate 102". Using curved flexure structures may substantially, if not completely eliminate uncertainty in buckling direction.

Figure 1L:
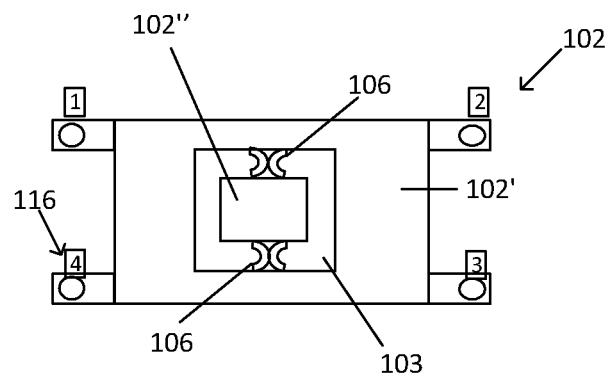
Figure 1M:
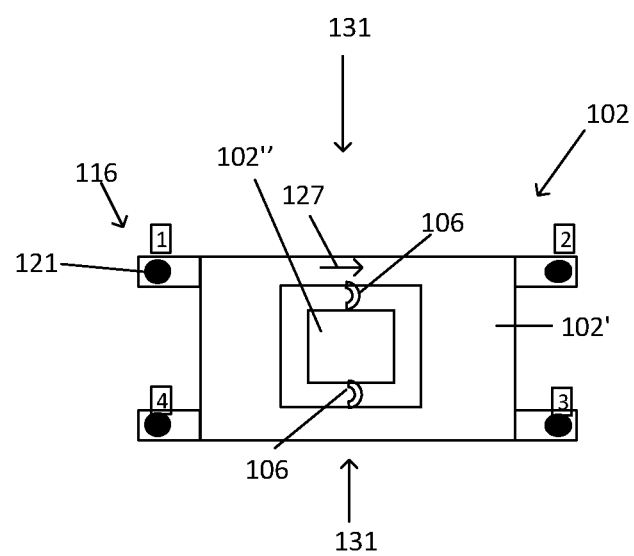

A curved shaped flexure structure 106 is depicted in FIGS. 1l-1m. The curved shape of the flexure bars/beam structures 106 may comprise any degree of curvature required for the particular application. In an embodiment, when the curved flexure beam structures (which are depicted as pairs of flexure beams 106) of FIG. 1l experiences a load 131 (FIG. 1m), the buckling direction 127 of the curved flexure beam structures 106 is substantially more reliable and repeatable than in non-curved flexure bars 106. In an embodiment, the curved flexure beam structures 106 may not experience any appreciable buckling. In an embodiment, the curved flexure beam structures 106 may resist buckling and may comprise predictable deformation, thus eliminating die cracking risks during compression.

Figure 1N:
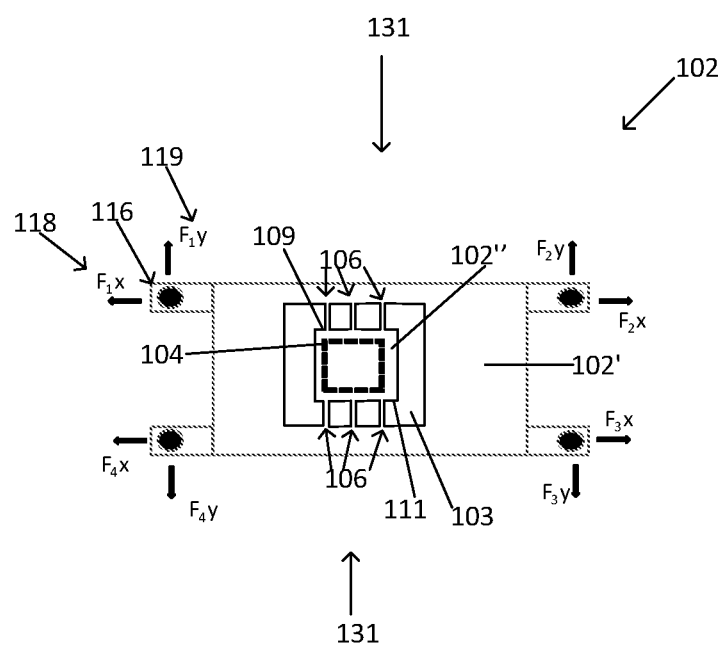

In another embodiment, a cooling structure 102 may comprise multiple flexure beam structures 106 on each opposing side of a die portion 102". For example, the cooling structure 102 in FIG. 1n comprises three flexure beams 106 on each opposing sides 109, 111 of the die plate 102". The cooling structures of the embodiments herein may comprise any number of flexure bars, which may be located in any convenient location, to connect a die portion to a bulk portion, depending upon the particular design requirements.

Figure 1O:
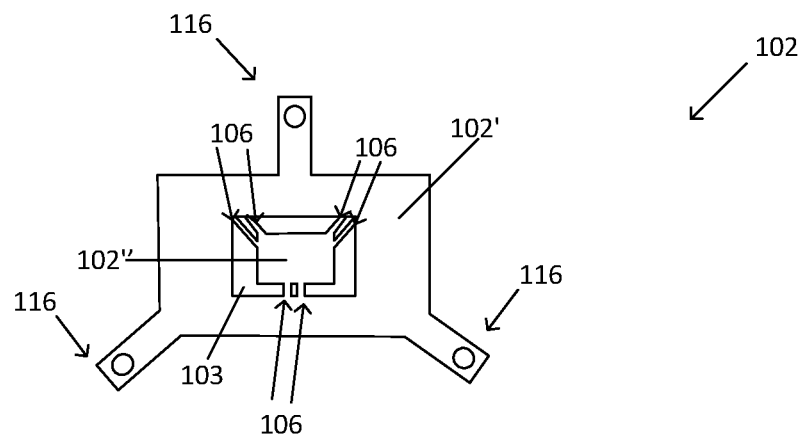
Figure 1P:
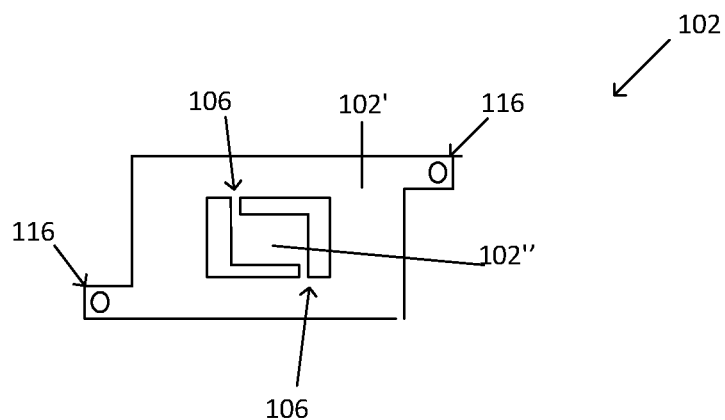

In another embodiment, the flexure bars 106 may be located in a triangular distribution around the die portion 102" (FIG. 1o), wherein sets of two flexure bars 106 may be arranged around an edge portion of the die plate 102", for a total of six bars 106 connecting the die plate 102" to the bulk portion 102' of the cooling structure 102. In an embodiment, a first, a second and a third flexure beam structure (which may comprise groups of two) may comprise about a 120 degree separation (triangular shape) from/between each other around an edge of the second section/die plate 102". In an embodiment, the cooling structure 102 may comprise three attachment portions 116 distributed in a triangular configuration about an edge of the bulk portion 102' of the cooling structure 102. In another embodiment, a diagonal arrangement of the flexure bars 106 of the cooling structure 102 may be employed, wherein the flexure bars 106 are positioned in diagonal corner locations of the die plate 102" (FIG. 1p). The diagonally positioned flex bars 106 connect the die plate 102" to the bulk portion 102' of the thermal solution 102, which comprises diagonally located attachment portions 116.

Figure 2:
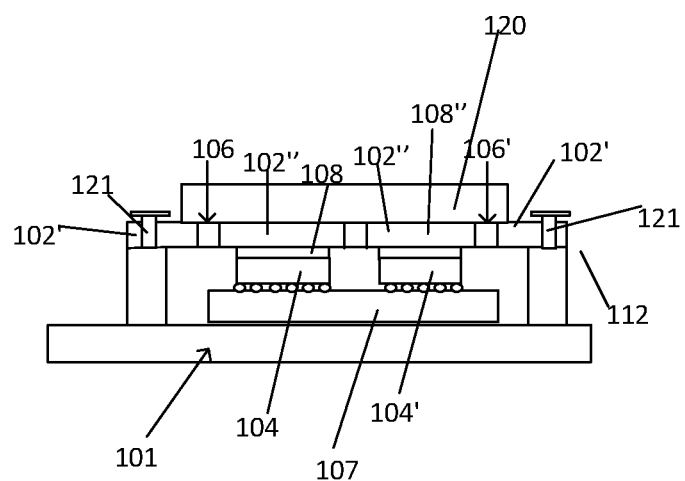
FIG. 2 represents a cross sectional view of a structure according to embodiments.

FIG. 2 depicts a cross sectional view of a package structure which may incorporate any of the flexure bar designs of the cooling structure embodiments included herein. A heat pipe 120 may be attached/coupled to a top side of the cooling structure 102, wherein the cooling structure 102 comprises a cold plate. The cold plate 102, comprises die plate portions 102", 102'" which may be disposed over a first die 104 and a second die 104' respectively. A bulk portion 102' may attached to a board 101 by the use of screws 121. The die 104, 104' may be disposed on a package substrate 107, which may be coupled with the board 101. First and second plates 108, which may or may not comprise TIM structures, may be disposed between the die 104, 104' and the die plates 102", 102'" respectively. In an embodiment, the cold plate 102 may be used in bare die applications, as well as in lap top applications for example.

The cold plate 102 design of the embodiments herein prevents die damage in bare die semiconductor packages (such as those used in client/mobile segment applications) that may be induced in previous, prior art designs during assembly and dis-assembly of thermal cold plate solutions. Tilting deformation of the cold plate 102 is thus avoided by the decoupling of load strain from the die. No impact to thermal performance—no impact on thermal performance due to decoupling of applied loads and die. Degradation of TIM and hence degradation of thermal performance is avoided.

By incorporating the flexible cooling structures of the embodiments described herein, thermal solutions can decouple thermal and mechanical requirements, while providing robust reliability of the microelectronic packages. Flexure structures in the form of beams or curved beams connect the cooling plates about the die to the rest of the cooling structure, and allows the die plate to deform under an enabling load (for example from the application of a heat sink). The ability to apply individual loads on each die of a multi chip package as loads on one part of a single cooling structure/IHS are decoupled is realized. Each die can have a unifrom bond line thickess (TIM thickness) even if die heights are different. The embodiments minimize stress on packaged die by the decoupling of applied loads from the resulting stress on the die. The cooling solution structures herein further find application in wearable devices which may require a thermal solution on top of a bare die semiconductor package, such as holographic/virtual reality based headsets and/or memory devices.

Figure 3:
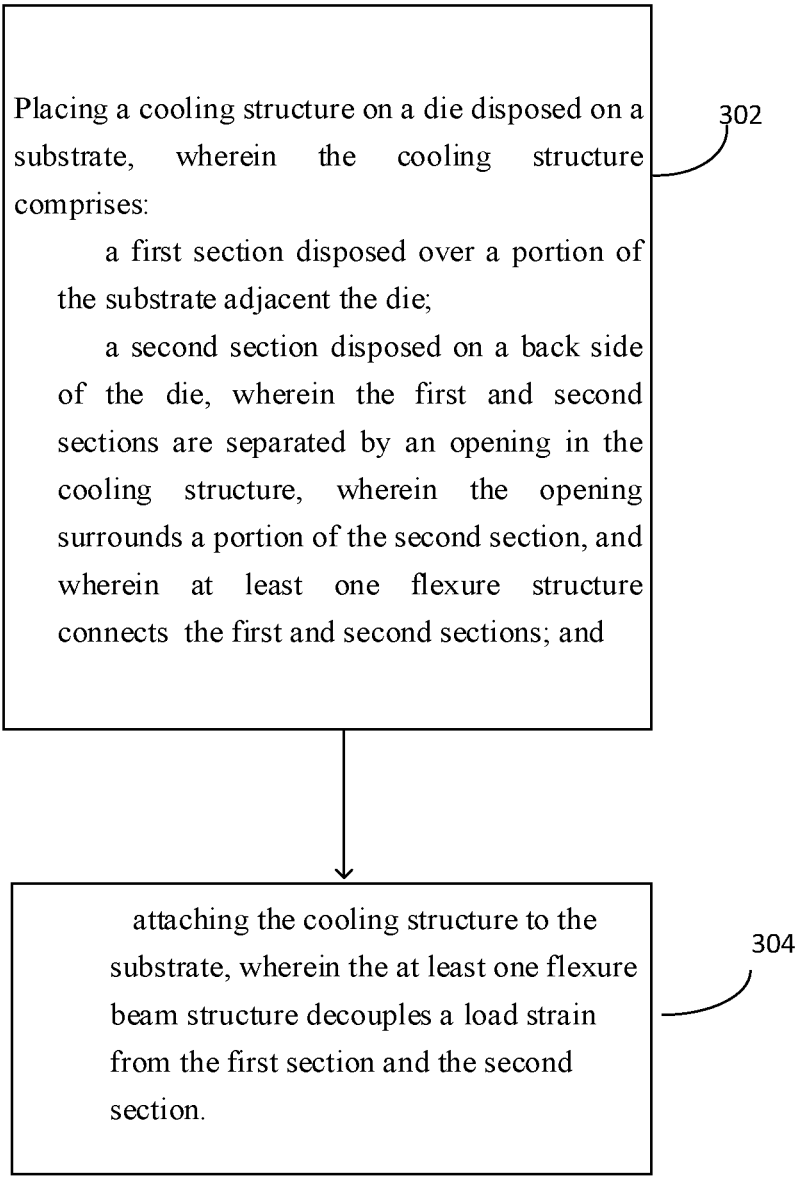
FIG. 3 represents a flow chart of a method according to embodiments.

FIG. 3 depicts a method according to embodiments herein. At step 302, a cooling structure may be placed on a die disposed on a substrate, wherein the cooling structure comprises: a first section disposed over a portion of the substrate adjacent the die; a second section disposed on a back side of the die, wherein the first and second sections are separated by an opening in the cooling structure, wherein the opening surrounds a portion of the second section, and wherein at least one flexure beam structure connects the first and second portions. The openings define the die plates that are disposed over the die, and the flexure beam structures connect the first and second portions of the cooling structure. The openings may comprise cut out portions in a metal sheet, such as a copper metal sheet. The cooling structure may comprise one of a heat spreader or a cold plate, in an embodiment.

At step 304, the cooling structure may be attached to the substrate, wherein the at least one flexure beam structure decouples a load strain from the first portion and the second portion. In an embodiment, load force components may be distributed away from the die through a flexing motion of the flexure beam structure.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
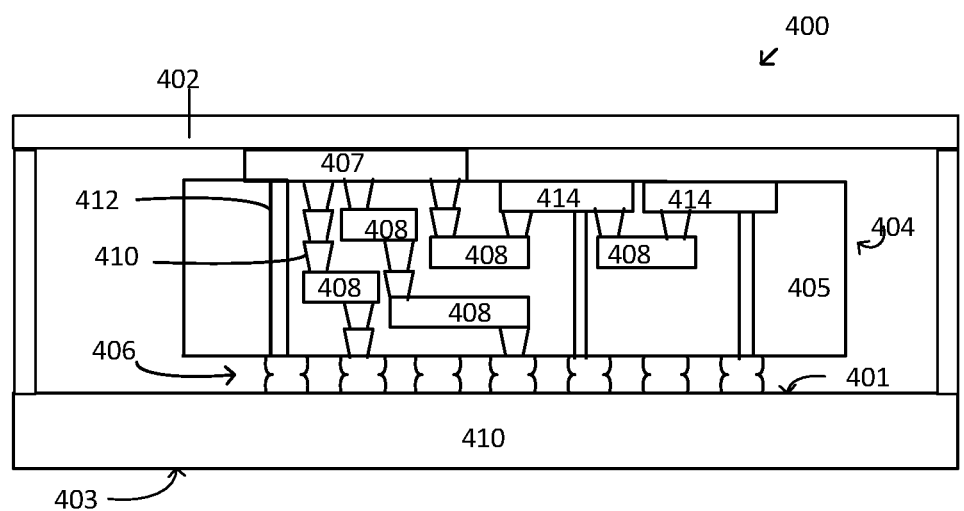
FIG. 4 represents a computer system implementing one or more embodiments.

Turning now to FIG. 4, illustrated is an embodiment of a computing system 400. The system 400 includes a mainboard 410 or other circuit board. Mainboard 410 includes a first side 401 and an opposing second side 403, and various components may be disposed on either one or both of the first and second sides 401, 403. In the illustrated embodiment, the computing system 400 includes a die 407, disposed on a substrate 404. A cooling structure 402 may be disposed on a top surface of the die 407, similar to the cooling structure of the various embodiments herein. The substrate 404 may comprise an interposer 404, for example. The substrate 404 may comprise various levels of conductive layers 414, 408, for example, which may be electrically and physically connected to each other by via structures 410. The substrate 404 may further comprise through substrate vias 412. Dielectric material 405 may separate/isolate conductive layers from each other within the substrate 404. Joint structures 406 may electrically and physically couple the substrate 404 to the board 410. The computing system 400 may comprise any of the embodiments described herein.

System 400 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 410 may comprise any other suitable substrate.

Figure 5:
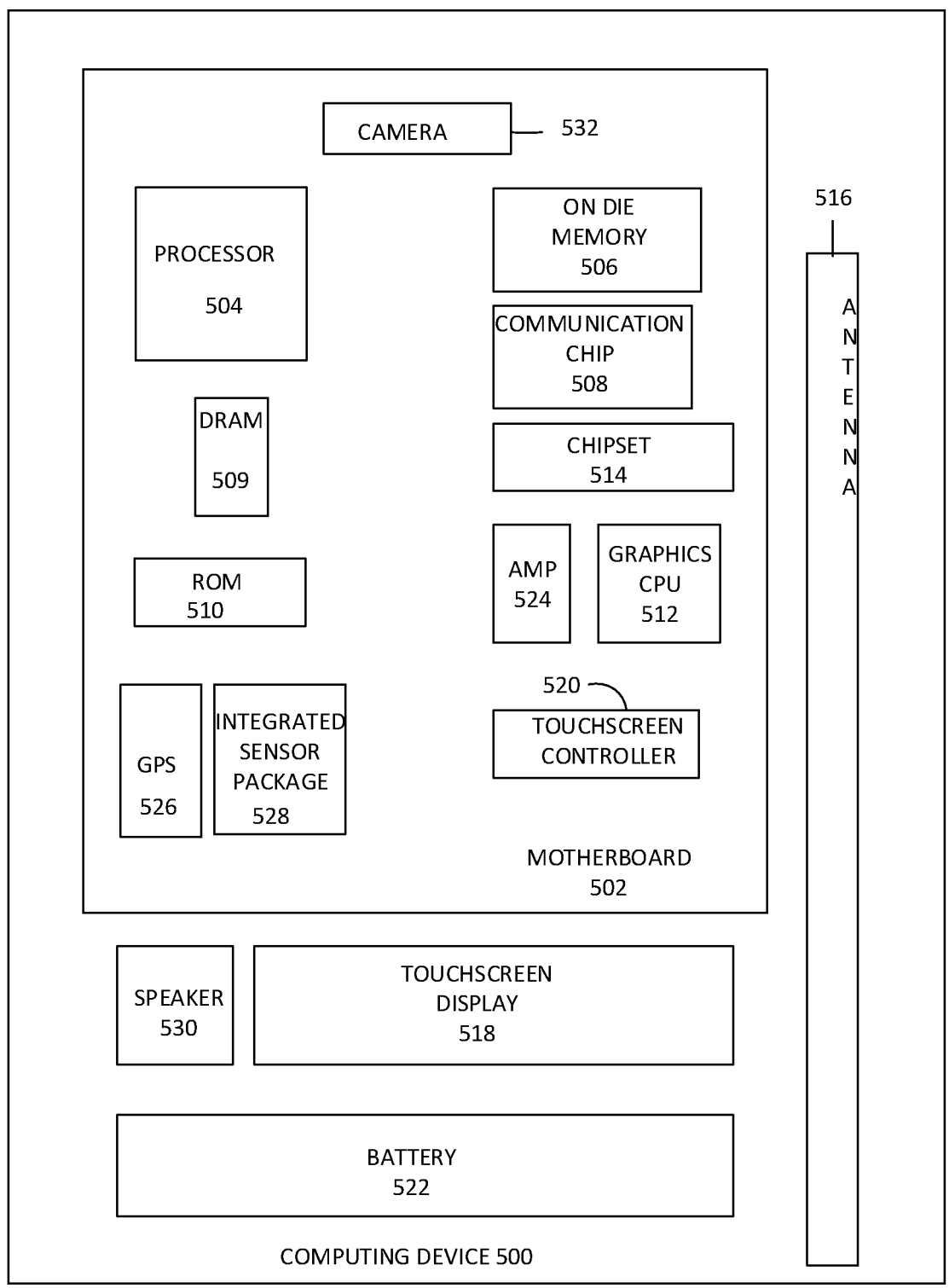
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, package structures of the various embodiments disclosed herein. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, an amplifier 524, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising: a first side of a die disposed on a substrate, a cooling structure disposed on a second side of the die, wherein the cooling structure comprises: a first section and a second section, a first opening adjacent a first edge of the second section, and a second opening adjacent a second edge of the second section, wherein the second section is disposed between the first opening and the second opening, and wherein the first section is disposed on an outer edge the first and second openings, wherein at least one flexure beam structure extends between the first and the second sections.

Example 2 includes the microelectronic package structure of example 1, wherein the cooling structure comprises an integrated heat spreader. Example 3 includes the microelectronic package structure of example 1 wherein the first section of the cooling structure comprises at least one attachment portion.

Example 4 includes the microelectronic package structure of example 3 wherein the at least one attachment portion comprises a fastener, and wherein the fastener is connected to a top surface of a motherboard.

Example 5 includes the microelectronic package structure of example 1 further comprising a second die on the substrate, wherein the cooling structure further comprises a third portion disposed between third and fourth openings, wherein additional flexure beam structures are disposed between the third portion and the first portion.

Example 6 includes the microelectronic package structure of example 1 wherein the at least one flexure beam structure comprises a plurality of flexure beam structures on a first side of the second section and a plurality of flexure beam structures on a second side of the second section.

Example 7 includes the microelectronic package structure of example 1 wherein the at least one flexure beam structure comprises a curved flexure beam structure.

Example 8 includes the microelectronic package structure of example 1 wherein the at least one flexure beam structure comprises a first, a second and a third flexure beam structure, wherein the first, second and third flexure beam structures comprise about a 120 degree separation from each other around an edge of the second section.

Example 9 is a microelectronic package structure comprising: a first side of a die on a first side of a substrate, a cooling structure on a second side of the die, wherein the cooling structure comprises: a first portion attached to the substrate, and a second portion disposed on a second side of the die, wherein the first and second portions are separated by an opening in the cooling structure, wherein the opening surrounds a portion of the second portion, and wherein at least one flexure beam structure connects the first and second portions.

Example 10 includes the microelectronic package structure of example 9 wherein the cooling structure comprises copper.

Example 11 includes the microelectronic package structure of example 9 wherein the first portion comprises an attachment portion capable of receiving a fastener to attach to the substrate.

Example 12 includes the microelectronic package structure of example 9 wherein a heat sink is disposed on a top surface of the cooling structure.

Example 13 includes the microelectronic package structure of example 9 wherein the substrate comprises a motherboard.

Example 14 includes the microelectronic package structure of claim 9 wherein the die comprises a portion of a bare die package.

Example 15 includes the microelectronic package structure of claim 9 wherein the microelectronic package structure comprises a portion of a multi die package.

Example 16 includes the device structure of example 9, wherein the cooling structure comprises one of a cold plate or an integrated heat spreader.

Example 17 is method of forming a microelectronic package structure, comprising: placing a cooling structure on a die disposed on a substrate, wherein the cooling structure comprises: a first portion disposed over a portion of the substrate adjacent the die, a second portion disposed on a back side of the die, wherein the first and second portions are separated by an opening in the cooling structure, wherein the opening surrounds a portion of the second portion, and wherein at least one flexure structure connects the first and second portions, and attaching the cooling structure to the substrate, wherein the at least one flexure beam structure decouples a load strain from the first portion and the second portion.

Example 18 includes the method of example 17 further comprising wherein the cooling structure comprises one of a heat spreader or a cold plate.

Example 19 includes the method of example 17 wherein the load force components are distributed away from the die through a flexing motion of the flexure beam structure.

Example 20 includes the method of example 17 further comprising wherein the flexure beam structure comprises a curved structure.

Example 21 includes the method of example 17 wherein a heat sink is attached to the cooling structure, and wherein the cooling structure deflects the load of the attached heat sink.

Example 22 includes the method of example 17 further comprising wherein the cooling structure comprises copper.

Example 23 includes the method of example 17 further comprising a heat pipe coupled to the cooling structure.

Example 24 includes the method of example 17 further comprising wherein the first portion comprises attachment portions to receive fasteners for fastening the first portion to the substrate.

Example 25 includes the method of example 17 wherein the substrate comprises a motherboard. Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
a first side of a die on a substrate;
a cooling structure on a second side of the die, wherein the cooling structure comprises:
a first section and a second section;
a first opening adjacent a first edge of the second section; and
a second opening adjacent a second edge of the second section,
wherein the second section is between the first opening and the
second opening, and wherein the first section is on an outer edge
the first and second openings, wherein at least one flexure beam structure extends between the first and the second sections, and wherein the at least one flexure beam structure comprises a first, a second and a third flexure beam structure, wherein the first, second and third flexure beam structures comprise about a 120 degree separation from each other around an edge of the second section.

2. The microelectronic package structure of claim 1, wherein the cooling structure comprises an integrated heat spreader.

3. The microelectronic package structure of claim 1, wherein the first section of the cooling structure comprises at least one attachment portion.

4. The microelectronic package structure of claim 3, wherein the at least one attachment portion comprises a fastener, and wherein the fastener is connected to a top surface of a motherboard.

5. The microelectronic package structure of claim 1, further comprising a second die on the substrate, wherein the cooling structure further comprises a third portion between third and fourth openings, wherein additional flexure beam structures are between the third portion and the first portion.

6. The microelectronic package structure of claim 1, wherein the at least one flexure beam structure comprises a plurality of flexure beam structures on a first side of the second section and a plurality of flexure beam structures on a second side of the second section.

7. The microelectronic package structure of claim 1, wherein the at least one flexure beam structure comprises a curved flexure beam structure.

8. The microelectronic package structure of claim 1, wherein the first, the second and the third flexure beam structures each comprise a set of at least two flexure beam structures.

9. A microelectronic package structure comprising:
a first side of a die on a first side of a substrate;
a cooling structure on a second side of the die, wherein the cooling structure comprises:
a first portion attached to the substrate; and
a second portion a second side of the die, wherein the first and second portions are separated by an opening in the cooling structure, wherein the opening surrounds a portion of the second portion, and wherein at least one flexure beam structure connects the first and second portions, and wherein the at least one flexure beam structure comprises a first, a second and a third flexure beam structure, wherein the first, second and third flexure beam structures comprise about a 120 degree separation from each other around an edge of the second section.

10. The microelectronic package structure of claim 9, wherein the cooling structure comprises copper.

11. The microelectronic package structure of claim 9, wherein the first portion comprises an attachment portion capable of receiving a fastener to attach to the substrate.

12. The microelectronic package structure of claim 9, wherein a heat sink is on a top surface of the cooling structure.

13. The microelectronic package structure of claim 9, wherein the substrate comprises a motherboard.

14. The microelectronic package structure of claim 9, wherein the die comprises a portion of a bare die package.

15. The microelectronic package structure of claim 9, wherein the microelectronic package structure comprises a portion of a multi die package.

16. The microelectronic package structure of claim 9, wherein the cooling structure comprises one of a cold plate or an integrated heat spreader.

17. A method of forming a microelectronic package structure, comprising:
placing a cooling structure on a die on a substrate, wherein the cooling structure comprises:
a first portion over a portion of the substrate adjacent the die;
a second portion on a back side of the die, wherein
the first and second portions are separated by an opening in the cooling structure, wherein the opening surrounds a portion of the
second portion, and wherein at least one flexure structure connects
the first and second portions, and wherein the at least one flexure beam structure comprises a first, a second and a third flexure beam structure, wherein the first, second and third flexure beam structures comprise about a 120 degree separation from each other around an edge of the second section; and
attaching the cooling structure to the substrate, wherein the at least one flexure beam structure decouples a load strain from the first portion and the second portion.

18. The method of claim 17, further comprising wherein the cooling structure comprises one of a heat spreader or a cold plate.

19. The method of claim 17, wherein the load force components are distributed away from the die through a flexing motion of the at least one flexure beam structure.

20. The method of claim 17, further comprising wherein the at least one flexure beam structure comprises a curved structure.

21. The method of claim 17, wherein a heat sink is attached to the cooling structure, and wherein the cooling structure deflects the load of the attached heat sink.

22. The method of claim 17, further comprising wherein the cooling structure comprises copper.

23. The method of claim 17, further comprising a heat pipe coupled to the cooling structure.

24. The method of claim 17, further comprising wherein the first portion comprises attachment portions to receive fasteners for fastening the first portion to the substrate.

25. The method of claim 17, wherein the substrate comprises a motherboard.

\* \* \* \* \*